(12) United States Patent
Tsukamoto et al.

(10) Patent No.: US 7,790,555 B2
(45) Date of Patent: Sep. 7, 2010

(54) SEMICONDUCTOR DEVICE MANUFACTURING METHOD WITH SPIN-COATING OF PHOTORESIST MATERIAL

(75) Inventors: Akiko Tsukamoto, Chiba (JP); Hisashi Hasegawa, Chiba (JP); Jun Osanai, Chiba (JP)

(73) Assignee: Seiko Instruments Inc. (JP)

( * ) Notice: Subject to any disclaimer, the term of this patent is extended or adjusted under 35 U.S.C. 154(b) by 453 days.

(21) Appl. No.: 11/805,195

(22) Filed: May 21, 2007

(65) Prior Publication Data

US 2007/0272984 A1 Nov. 29, 2007

(30) Foreign Application Priority Data

May 29, 2006 (JP) .............................. 2006-148448

(51) Int. Cl.
*H01L 21/336* (2006.01)
(52) U.S. Cl. ............... 438/284; 257/364; 257/E21.004; 257/E27.016
(58) Field of Classification Search ................. 438/284; 257/364

See application file for complete search history.

(56) References Cited

FOREIGN PATENT DOCUMENTS

JP 10303098 11/1998

*Primary Examiner*—W. David Coleman
*Assistant Examiner*—Sonya D McCall-Shepard
(74) *Attorney, Agent, or Firm*—Adams & Wilks (57) ABSTRACT

A semiconductor device manufacturing method includes a field oxide insulation film forming step, an electrode forming step, and a resistor forming step. The field oxide insulation film forming step comprises forming a field oxide insulation film on a surface of the semiconductor substrate so that a portion which corresponds to a side surface portion for each of active regions formed on the surface of the semiconductor substrate, which opposes a rotation center of the surface of the semiconductor substrate in spin-coating of a photoresist in the electrode forming step, and which is located at a front side of a centrifugal force acting direction along the surface of the semiconductor substrate has a curved surface that is convex in a forward direction of the centrifugal force along the surface of the semiconductor substrate as seen in plan view of the semiconductor substrate.

17 Claims, 6 Drawing Sheets

SEMICONDUCTOR DEVICE MANUFACTURING METHOD WITH SPIN-COATING OF PHOTORESIST MATERIAL

BACKGROUND OF THE INVENTION

1. Field of the Invention

The present invention relates to a semiconductor device manufacturing method and a semiconductor device.

2. Description of the Related Art

As disclosed in JP 10-303098 A, a semiconductor device in this field is generally formed in the order of the following steps: a field oxide insulation film forming step in which a surface of a semiconductor substrate is subjected to local oxidization to form a field oxide insulation film, which grows thick along the surface of the semiconductor substrate, to divide the surface of the semiconductor substrate into a plurality of active regions; an electrode forming step in which an electrode film is formed on the surface of the semiconductor substrate, photoresist, which is applied to the surface of the electrode film by spin-coating, is exposed to light, and an unnecessary portion of the electrode film is etched and removed to form an electrode; and a resistor forming step in which a resistor film is formed on the surface of the semiconductor substrate, photoresist, which is applied to the surface of the resistor film by spin-coating, is exposed to light, and an unnecessary portion of the resistor film is etched and removed to form a resistor.

In these steps, a non-flat structure has been formed on the surface of the semiconductor substrate at the time of the electrode film formation in which a convex portion consists of the field oxide insulation film and a concave portion consists of the active region. The surface of the electrode film, which is formed on such a semiconductor substrate, is then also made uneven corresponding to the unevenness of the surface of the semiconductor substrate. Accordingly it is difficult to apply a photoresist so as to have a uniform thickness through spin-coating on the surface of such electrode film, and an uneven coating may consequently result.

More precisely, when the photoresist flows into a concave portion, which corresponds to an underlying active region, on the surface of the electrode film, the photoresist concentrates at the corner which is surrounded by side surface portions of the convex portion opposing to a rotation center in the surface of the semiconductor substrate for the spin-coating in a centrifugal force acting direction along the surface of the semiconductor substrate, and which locates in the forward side of the centrifugal force acting direction when the semiconductor substrate is seen in a plan view. A certain amount of concentrated photoresist, then, flows out of the concave portion. Uneven coating, as a result, may occur in a portion, on the surface of the electrode film, in the forward side of the corner along the centrifugal force acting direction.

In the above-mentioned semiconductor device manufacturing method, the uneven coating of photoresist on the surface of the electrode film lowers a dimension accuracy of the electrode, further affecting the subsequent resistor forming step, which leads to a lowering in the dimension accuracy of the resistor to the extent that the semiconductor device will not have desired characteristics.

SUMMARY OF THE INVENTION

The present invention has been made in view of the above, and it is an object of the present invention to provide a semiconductor device manufacturing method and a semiconductor device which can provide for the even application of a photoresist by spin-coating to achieve a semiconductor device having desired characteristics.

To solve the problems and to attain the object as described above, according to the present invention, there is provided a semiconductor device manufacturing method comprising:

a field oxide insulation film forming step comprising:
  subjecting a surface of a semiconductor substrate to local oxidization;
  forming a field oxide insulation film along the surface of the semiconductor substrate; and
  dividing the surface of the semiconductor substrate into a plurality of active regions by using the field oxide insulation film;

an electrode forming step comprising:
  forming an electrode film on the surface of the semiconductor substrate;
  applying a photoresist on a surface of the electrode film by spin-coating;
  exposing the photoresist to light; and
  etching and removing an unnecessary portion of the electrode film, to form an electrode; and a resistor forming step comprising:
  forming a resistor film on the surface of the substrate;
  applying a photoresist on a surface of the resistor film by spin-coating;
  exposing the photoresist to light; and
  etching and removing an unnecessary portion of the resistor film, to form a resistor;

wherein the field oxide insulation film forming step includes forming the field oxide insulation film so that a portion which constitutes a side surface portion for each of the active regions, and which opposes a rotation center of the surface of the semiconductor substrate for the spin-coating, and which locates at a front side of a centrifugal force acting direction along the surface of the semiconductor substrate has a curved surface convex to a forward direction of the centrifugal force along the semiconductor substrate.

Further, according to the present invention, there is provided a semiconductor device comprising:

a field oxide insulation film disposed along a surface of a semiconductor substrate, the field oxide insulation film dividing the surface of the semiconductor substrate into a plurality of active regions;
an electrode; and
a resistor;

wherein the field oxide insulation film has a portion which constitutes a side surface portion for each of the active regions, and which opposes a rotation center of the surface of the semiconductor substrate for the spin-coating, and which locates at a front side of a centrifugal force acting direction along the surface of the semiconductor substrate has a curved surface convex to a forward direction of the centrifugal force along the semiconductor substrate.

According to the present invention as described above, in the field oxide insulation film forming step, the field oxide insulation film is formed so that, of the side surface portion of the active regions, the portion located in the front side of the centrifugal force acting direction in the spin-coating has the curved surface convex to the forward side of the centrifugal force acting direction along the semiconductor substrate. During the spin-coating in the electrode forming step, the photoresist flown into the concave portions corresponding to the active regions on the surface of the electrode film can flow out of the concave portions in a dispersed manner without concentrating to a small area. Accordingly, uneven coating can be prevented in a portion located in the front side of the centrifugal force acting direction with respect to the concave portions on the surface of the electrode film, giving higher dimension accuracy in the electrode formation. Consequently lowering in dimension accuracy of the resistor, which is formed after the formation of the electrode, due to the lowering in dimension accuracy of the electrode can also be prevented, enabling formation of a semiconductor device having desired characteristics.

Further, deviation in dimension accuracy among a plurality of electrodes and resistors according to their locations on the surface of the semiconductor substrate can also be prevented.

In the semiconductor device manufacturing method as described above, the electrode forming step may include etching and removing an unnecessary portion so that, in the electrode, a portion, which corresponds to a side surface portion of the electrode opposing a rotation center in the spin-coating on the surface of the semiconductor substrate in the centrifugal force acting direction along the surface of the semiconductor substrate and located in a backward side of the centrifugal force acting direction, has a curved surface convex to the backward side of the centrifugal force acting direction along the semiconductor substrate.

Further, in the semiconductor device as described above, the electrode may include a portion, which corresponds to a side surface portion of the electrode opposing a rotation center in the spin-coating on the surface of the semiconductor substrate in the centrifugal force acting direction along the surface of the semiconductor substrate and located in a backward side of the centrifugal force acting direction, having a curved surface convex to the backward side of the centrifugal force acting direction along the semiconductor substrate.

Herein, in the electrode forming step, the electrode is formed so that the portion of the side surface portion of the electrode, located in the backward side of the centrifugal force acting direction in the spin-coating, has the curved surface convex to the backward side of the centrifugal force acting direction along the semiconductor substrate. The form of the electrode enables smooth mounting of the photoresist, which has collided with the convex portion corresponding to the electrode on the surface of the resistor film, onto the surface of the convex portion with less resistance. Accordingly, uneven coating on the surface of the convex portion and a portion located in the front side of the centrifugal force acting direction with respect to the convex portion on the surface of the resistor film can be prevented, enabling formation of a resistor having higher dimension accuracy, which enables certain formation of a semiconductor device having desired characteristics together with higher dimension accuracy in the electrode as described above.

DETAILED DESCRIPTION OF THE PREFERRED EMBODIMENT

Hereinafter, referring to FIGS. 1 to 12, an embodiment of the present invention will be described. A semiconductor device manufacturing method of the present invention includes: a field oxide insulation film forming step including: subjecting a surface of a semiconductor substrate 11 to local oxidization method (a so-called LOCOS method); forming a field oxide insulation film 12 that grows thick with respect to the surface of the semiconductor substrate 11; and defining the surface of the semiconductor substrate 11 into a plurality of active regions 13 by using the field oxide insulation film 12; an electrode forming step including: forming an electrode film 14 on the surface of the semiconductor substrate 11; applying a photoresist 15 on a surface of the electrode film 14 by spin-coating; exposing the photoresist 15 to light; and etching and removing an unnecessary portion of the electrode film 14, to form an electrode 16; and a resistor forming step including: forming a resistor film 17 on the surface of the substrate 11; applying a photoresist 15 on a surface of the resistor film 17 by spin-coating; exposing the photoresist 15 to light; and etching and removing an unnecessary portion of the resistor film 17, to form resistors 18a and 18b. In each of the steps as described above, in the case of spin-coating of the photoresist 15, the photoresist 15 is dropped to or in the vicinity of a rotation center on the surface of the semiconductor substrate 11.

Hereinafter, the respective steps will be described in detail.

Figure 1:
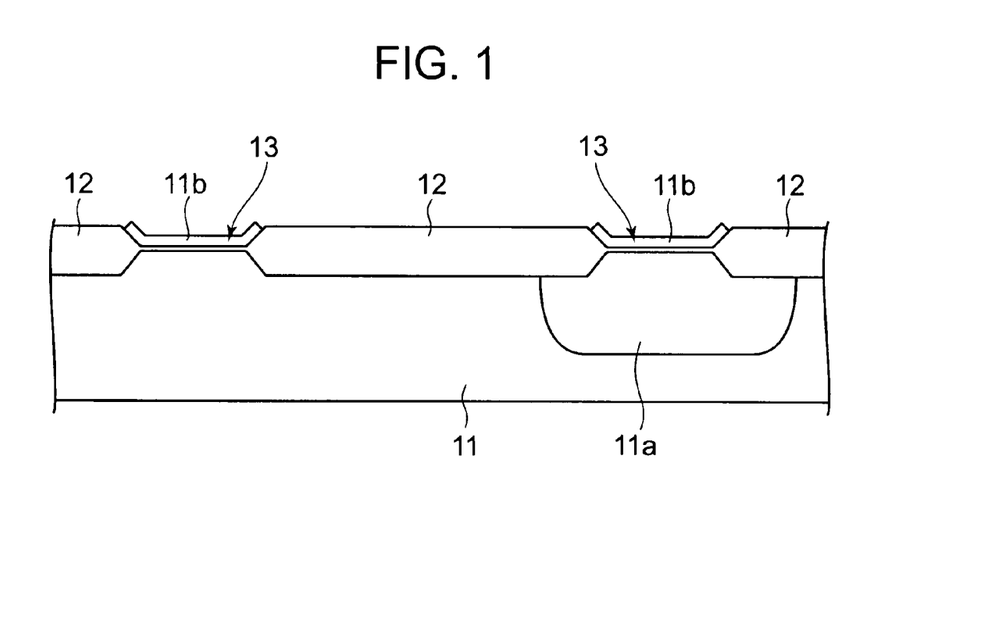
FIG. 1 is a diagram showing a first step of a semiconductor device manufacturing method according an embodiment of the present invention.

First, referring to FIG. 1, the field oxide insulation film forming step will be described.

In the field oxide insulation film forming step, first, on a surface of the semiconductor substrate 11, part of portions in which the active regions 13 (described later) are to be formed is ion-implemented with impurities. The obtained portion is then subjected to anneal processing at a high temperature to diffuse the impurities thereby forming a well diffusion layer 11a. Herein, in a case where the semiconductor substrate 11 is made of, for example, P-type silicon, the ion-implementation is performed with phosphorus as impurities to obtain the well diffusion layer 11a of N-type. Next, the surface of the semiconductor substrate 11 is locally oxidized while masks 11b each of which is patterned so as to correspond to a shape in a plan view of the field oxide insulation film 12 to be formed and made of, for example, silicon nitride are arranged so as to face the surface of the semiconductor substrate 11, thereby forming the field oxide insulation film 12. The field oxide insulation film 12 swells inward with respect to the surface of the original semiconductor substrate 11 as well as outward, and whole swelled portion has a thickness of 6000 Å to 8000 Å. Due to the field oxide insulation film 12 thus obtained, the plurality of active regions 13 are defined on the surface of the semiconductor substrate 11. It should be noted that each of the active regions 13 is entirely surrounded by the field oxide insulation film 12.

In this case, the surface of the semiconductor substrate 11 is formed unevenly while the field oxide insulation film 12 is convex with respect to the surface of the semiconductor substrate 11 and each of the active regions 13 is concave with respect thereto.

Next, referring to FIGS. 2 to 4, the electrode forming step will be described.

In the electrode forming step, first, each of the active regions 13 is subjected to thermal oxidation processing thereby forming gate oxide insulation films 11c each having a thickness of 100 Å to 400 Å. Then, each of the gate oxide insulation films 11c is ion-implemented, thereby imparting a desired threshold voltage with respect to each of the gate oxide insulation films 11c.

Next, the electrode film 14 made of, for example, polysilicon, is formed by a CVD method on the substantially entire surface of the semiconductor substrate 11. In this case, the electrode film 14 is formed uneven so as to correspond to the uneven surface of the semiconductor substrate 11. In other words, the electrode film 14 has convex portions 14a and concave portions 14b. The convex portions 14a correspond to the portions in which the field oxide insulation films 12 are formed, and the concave portions 14b correspond to the portions in which the active regions 13 are formed. Then, the electrode film 14 is ion-implemented with impurities such as boron or $BF_2$, thereby forming the entire electrode film 14 into $P^+$-type polysilicon (FIG. 2).

Subsequently, the surface of the electrode film 14 is sputtered or the like to form a tungsten silicide layer 19 made of refractory metal silicide. Then, the surface of the tungsten silicide layer 19 is spin-coated with the photoresist 15, a mask having a pattern is arranged thereon, the whole is exposed to light, and unnecessary portions are etched and removed, thereby forming the plurality of electrodes 16 formed of $P^+$-type polysilicon (FIG. 3). It should be noted that in the example of FIG. 3, the plurality of electrodes 16 are arranged on the respective active regions 13.

Figure 4:
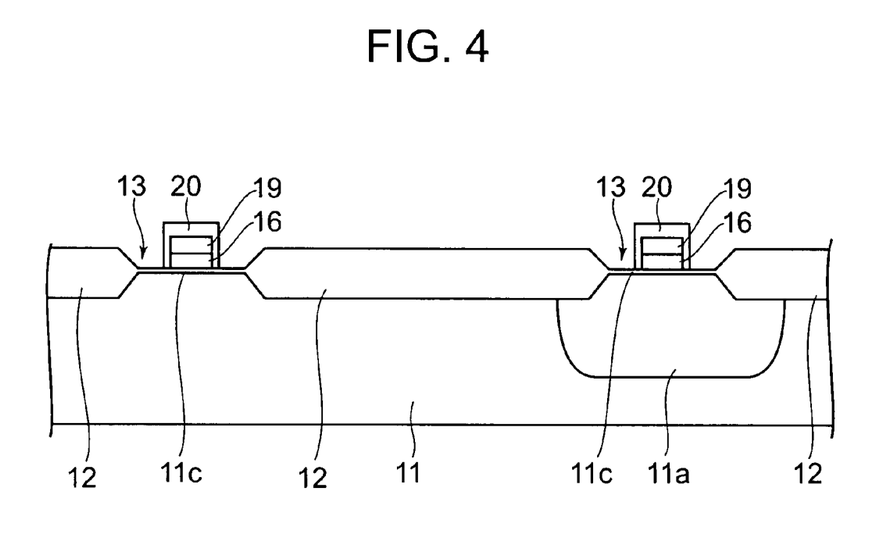
FIG. 4 is a diagram showing a fourth step of the semiconductor device manufacturing method according the embodiment of the present invention.

Then, each of the photoresists 15 arranged on the surface of the electrode 16 is removed, and a thermal oxidation CVD method, a low-pressure CVD method, or the like is performed, thereby forming oxide insulation films 20 so as to cover the outer surfaces of the plurality of electrodes 16 and the tungsten silicide layers 19 (FIG. 4).

Next, referring to FIGS. 5 to 11, the resistor forming step will be described.

Figure 5:
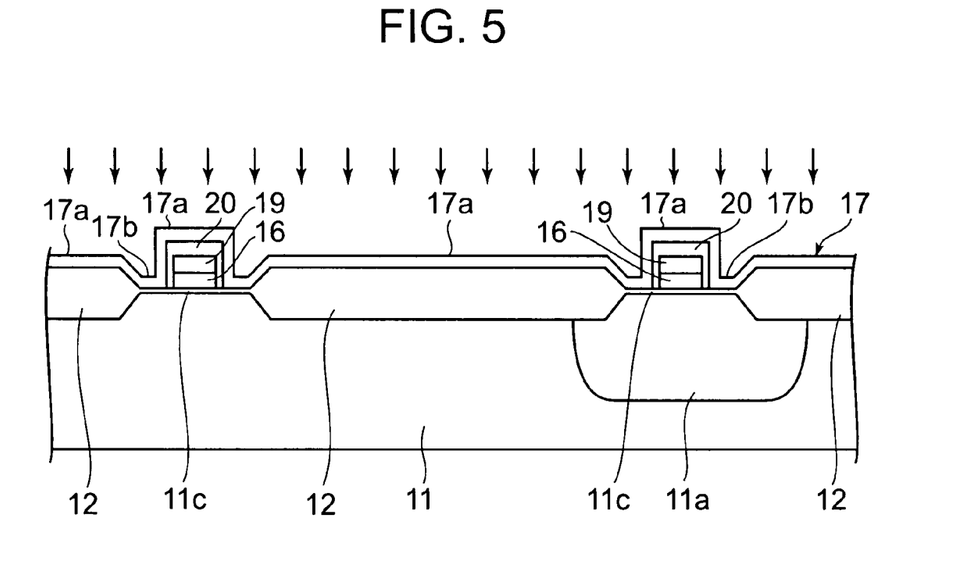
FIG. 5 is a diagram showing a fifth step of the semiconductor device manufacturing method according the embodiment of the present invention.

In the resistor forming step, first, the resistor film 17 made of, for example, polysilicon and having a thickness of 500 to 3000 Å is formed by the CVD method or the sputtering method on the substantially entire surface of the semiconductor substrate 11. In this case, the resistor film 17 has convex portions 17a and concave portions 17b. The convex portions 17a correspond to the portions in which the field oxide insulation films 12 are formed and the portions in which the electrodes 16 are formed. The field oxide insulation films 12 are convex with respect to the surface of the semiconductor substrate 11. The concave portions 17b correspond to the portions in which the active regions 13 are formed. The active regions 13 are concave with respect to the surface of the semiconductor substrate 11. Then, the entire surface of the resistor film 17 is ion-implemented with impurities such as boron or $BF_2$ in the dosage of, for example, approximately $1\times10^{14}$ atoms/cm$^2$, thereby forming the entire resistor film 17 into low-concentration P-type polysilicon (FIG. 5).

Figure 6:
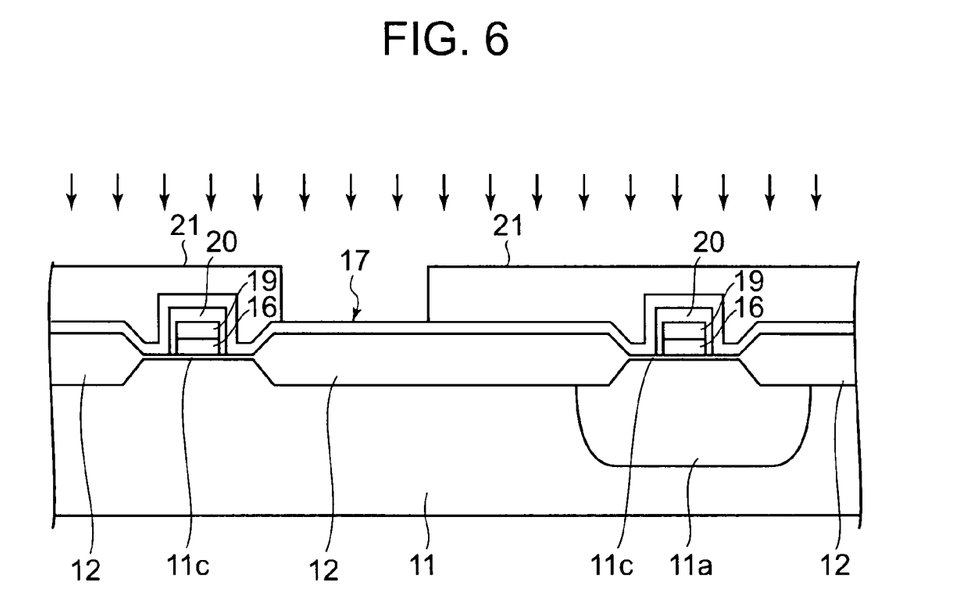
FIG. 6 is a diagram showing a sixth step of the semiconductor device manufacturing method according the embodiment of the present invention.

Then, photoresists 21 are patterned on the surface of the resistor film 17 so that a predetermined portion of the resistor film 17 (in the example of FIG. 6, part of a portion of the resistor film 17 arranged on the field oxide insulation films 12) is locally exposed. After that, the predetermined portion of the resistor film 17 is ion-implemented with impurities such as boron or $BF_2$, thereby forming a resistor film having a different impurity concentration. It is also possible to form an N-type resistor film by performing ion-implementation with phosphorus or arsenic (FIG. 6).

Figure 7:
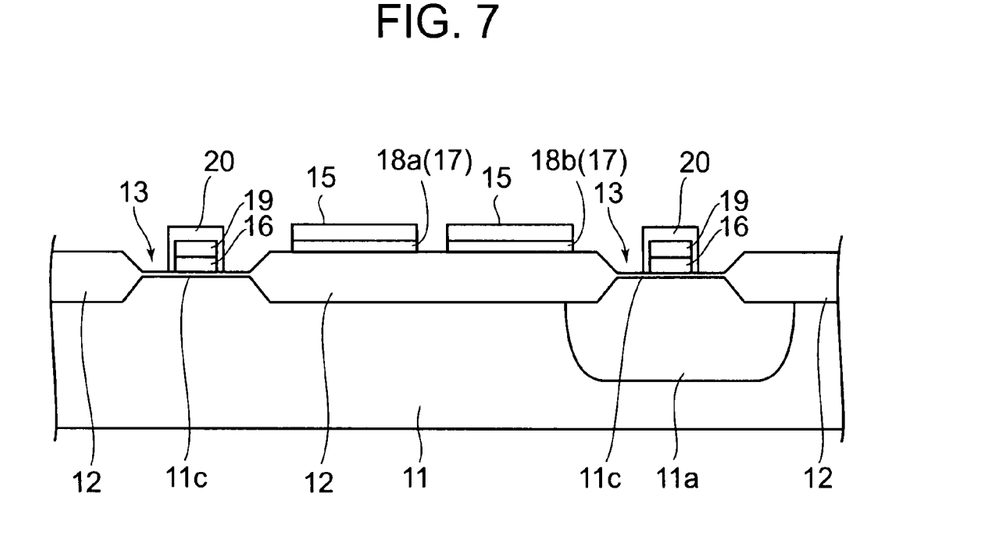
FIG. 7 is a diagram showing a seventh step of the semiconductor device manufacturing method according the embodiment of the present invention.

Subsequently, the photoresists 21 are removed from the surface of the resistor film 17, the photoresist 15 is applied to the surface of the resistor film 17 by spin-coating, a mask having a pattern which corresponds to a pattern formation of the plurality of resistors 18a and 18b to be formed is arranged on the surface of the semiconductor substrate 11, and the whole is exposed to light. After that, unnecessary portions of the resistor film 17 are removed by performing, for example, an anisotropic dry etching (specifically, RIE), thereby forming the first resistor 18a and the second resistor 18b. The first resistor 18a is made of N-type polysilicon of the predetermined portion of the resistor film 17, and the second resistor 18b is made of P-type polysilicon (FIG. 7).

Figure 8:
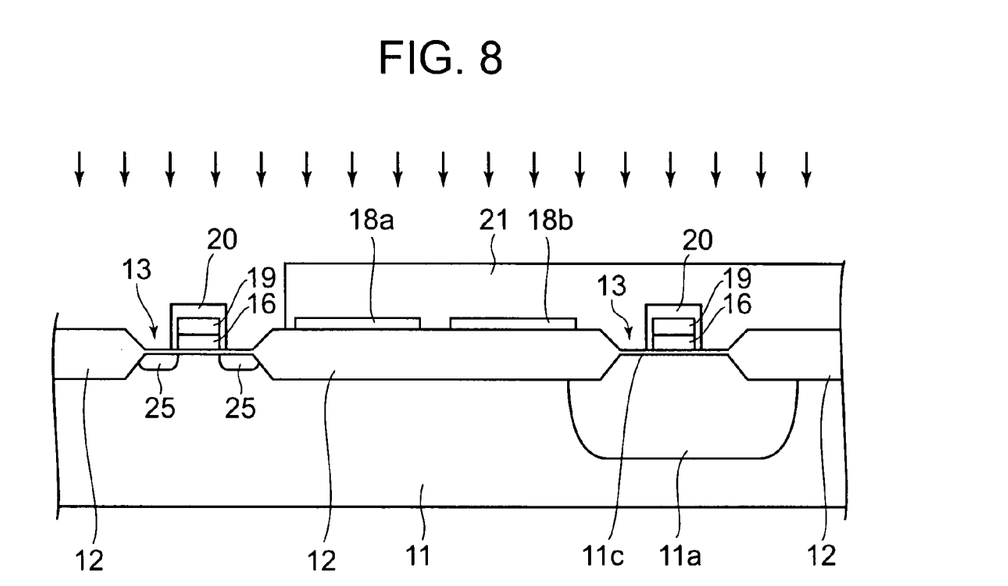
FIG. 8 is a diagram showing an eighth step of the semiconductor device manufacturing method according the embodiment of the present invention.

Next, the photoresists 15 arranged on the surfaces of the first resistor 18a and the second resistor 18b are removed, the photoresist 21 is patterned so that a portion of the plurality of active regions 13 in which the well diffusion layer 11a is not formed is locally exposed, and the exposed active region 13 is ion-implemented with arsenic. Portions of the active region 13 continuous to and peripheral to the electrode 16 are made to have an impurity concentration of $1\times10^{16}$ atoms/cm$^3$ to $1\times10^{18}$ atoms/cm$^3$, thereby forming N-type low-concentration impurity regions 25 (FIG. 8).

Figure 9:
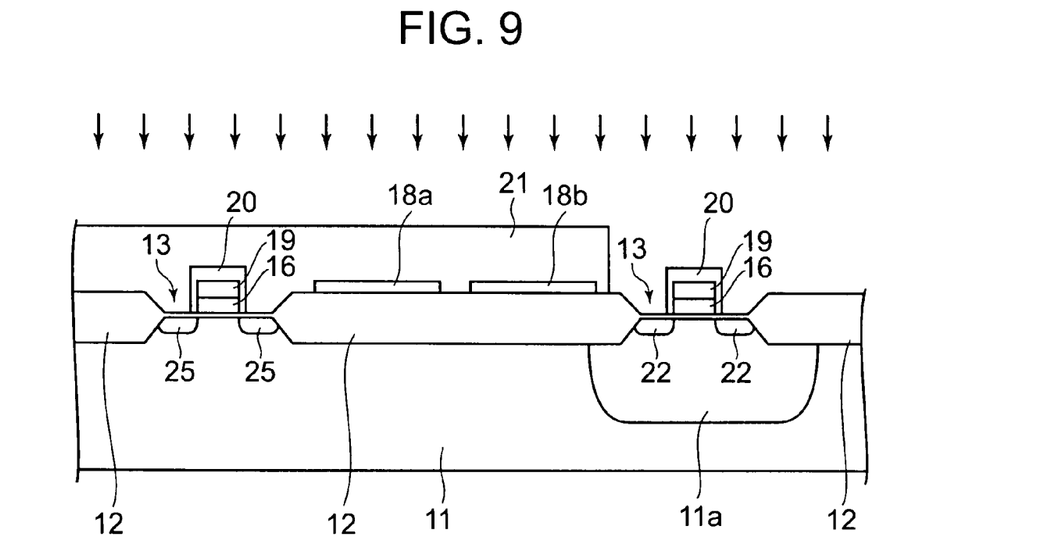
FIG. 9 is a diagram showing a ninth step of the semiconductor device manufacturing method according the embodiment of the present invention.

Then, the photoresist 21 is removed, another photoresist 21 is patterned so that a portion of the plurality of active regions 13 in which the well diffusion layer 11a is formed is locally exposed, and the well diffusion layer 11a formed in the exposed active region 13 is ion-implemented with boron or $BF_2$. Portions of the well diffusion layer 11a continuous to and peripheral to the electrode 16 are made to have an impurity concentration of $1\times10^{16}$ atoms/cm$^3$ to $1\times10^{18}$ atoms/cm$^3$, thereby forming P-type low-concentration impurity regions 22 (FIG. 9).

Figure 10:
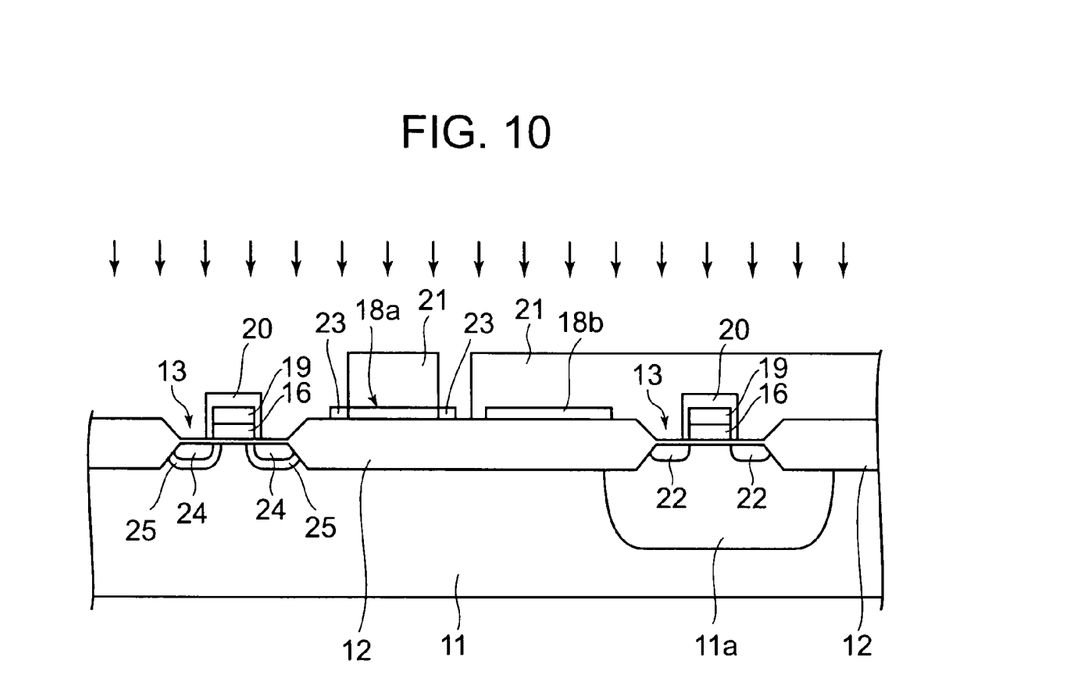
FIG. 10 is a diagram showing a tenth step of the semiconductor device manufacturing method according the embodiment of the present invention.

Next, the photoresist 21 is removed, and another photoresist 21 is patterned so as to locally cover the active region 13 including the well diffusion layer 11a and the P-type low-concentration impurity regions 22 and a portion of the first resistor 18a excluding outer peripheral portions thereof. The outer peripheral portions of the first resistor 18a and the N-type low-concentration impurity regions 25 on the surface of the semiconductor substrate 11 are ion-implemented with arsenic at a dose amount of, for example, $5\times10^{15}$ atoms/cm$^2$. Accordingly, the outer peripheral portions of the first resistor 18a are formed as high-concentration impurity regions 23 so that conductive lines made of, for example, an aluminum alloy can be satisfactorily connected. Further, in the N-type low-concentration impurity regions 25, N-type high-concentration impurity regions 24 are formed so as to include favorable characteristics as a source and a drain of an NMOS transistor. The active region 13 in which the N-type low-concentration impurity regions 25 and the N-type high-concentration impurity regions 24 are formed can thus serve as an NMOS transistor (FIG. 10).

Figure 11:
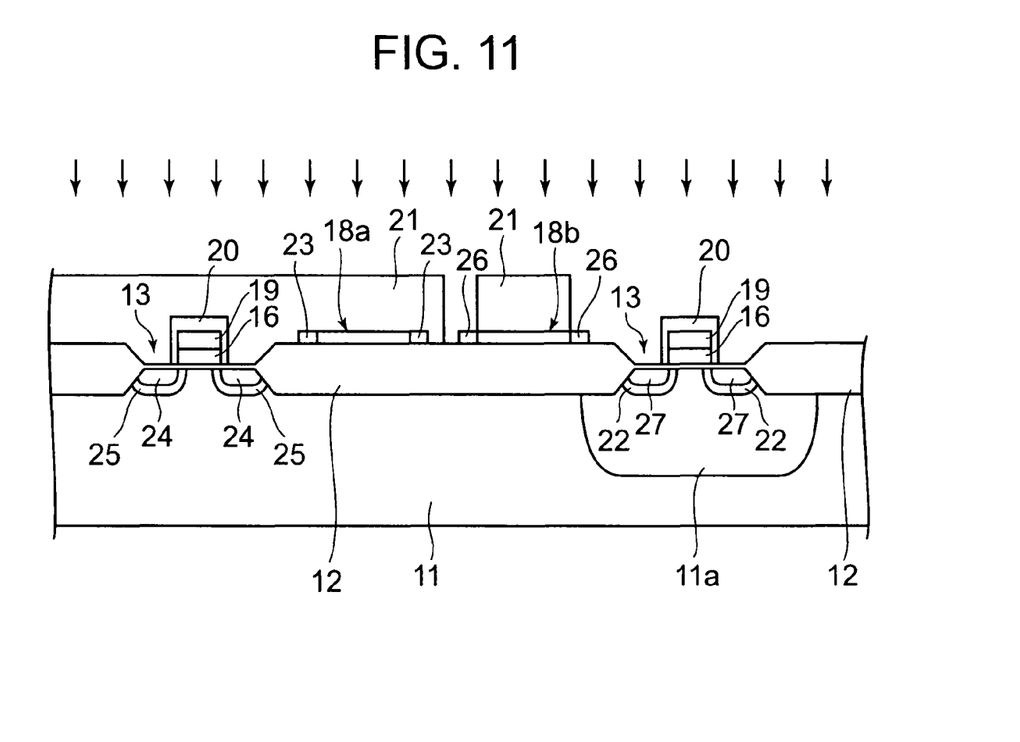
FIG. 11 is a diagram showing an eleventh step of the semiconductor device manufacturing method according the embodiment of the present invention.

Then, the photoresist 21 is removed, and another photoresist 21 is patterned so as to locally cover the first resistor 18, the active region 13 serving as an NMOS transistor, and a portion of the second resistor 18b excluding outer peripheral portions thereof. The outer peripheral portions of the second resistor 18b and the P-type low-concentration impurity regions 22 on the surface of the semiconductor substrate 11 are ion-implemented with $BF_2$ at a dose amount of, for example, $5 \times 10^{15}$ atoms/cm$^2$. Accordingly, the outer peripheral portions of the second resistor 18b are formed as high-concentration impurity regions 26 so that conductive lines made of, for example, an aluminum alloy can be satisfactorily connected. Further, in the P-type low-concentration impurity regions 22, P-type high-concentration impurity regions 27 are formed so as to include favorable characteristics as a source and a drain of a PMOS transistor. The active region 13 in which the P-type low-concentration impurity regions 22 and the P-type high-concentration impurity regions 27 are formed can thus serve as a PMOS transistor (FIG. 11).

After that, as in the case of the conventional semiconductor device manufacturing process, an intermediate insulating film, contact holes, conductive lines, a protective film, and the like are formed, thereby forming an MOS semiconductor device.

Figure 12:
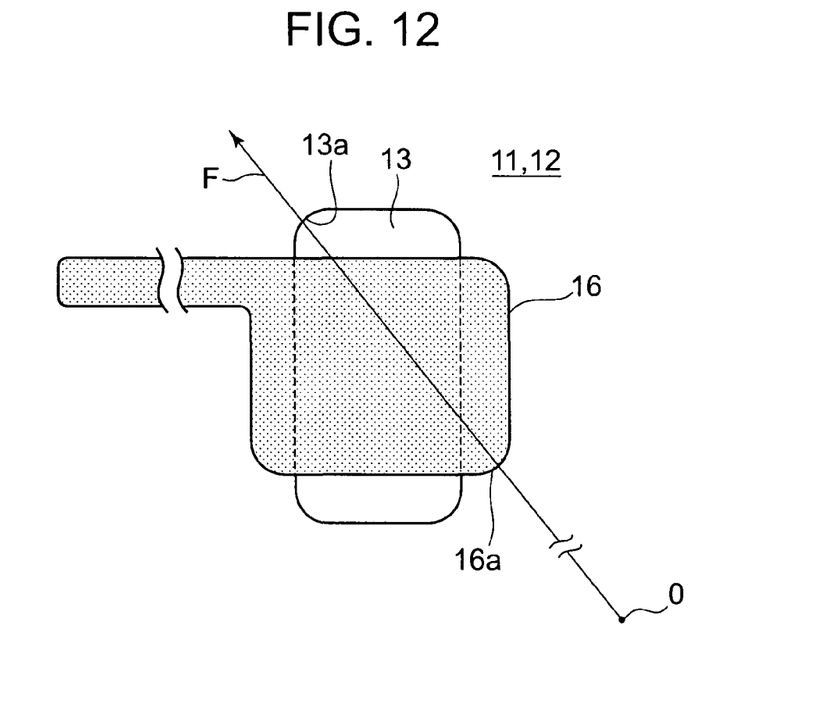
FIG. 12 is a plan view of an active region of a semiconductor device according the embodiment of the present invention.

As shown in FIG. 12, in the field oxide insulation film forming step according to the embodiment of the present invention, the field oxide insulation film 12 is formed so that, in the active region 13, a portion 13a, which corresponds to a side surface portion of the active region 13 opposing a rotation center O during spin-coating of the photoresist in the electrode forming step on the surface of the semiconductor substrate 11 and which is located at a front side of a centrifugal force acting direction F along the surface of the semiconductor substrate 11 and located in a forward side of the centrifugal force acting direction F, has a curved surface convex to the forward side of the centrifugal force acting direction F when the semiconductor substrate 11 is seen in a plan view. In the example of FIG. 12, the active region 13 has a rectangular shape in a plan view and four corners each having a curved surface convex to an outer side of the active region 13.

Further, in the electrode forming step, as shown in FIG. 12, an unnecessary portion of the electrode film 14 is etched and removed so that, in the electrode 16, a portion 16a, which corresponds to a side surface portion of the electrode 16 opposing a rotation center O during spin-coating of the photoresist in the electrode forming step on the surface of the semiconductor substrate 11 in the centrifugal force acting direction F along the surface of the semiconductor substrate 11 and located in a backward side of the centrifugal force acting direction F, has a curved surface convex to the backward side of the centrifugal force acting direction F when the semiconductor substrate 11 is seen in a plan view. In the example of FIG. 12, each of all corners of the electrode 16 has a curved surface convex to an outer side of the electrode 16.

As described above, according to the semiconductor device manufacturing method and the semiconductor device of the embodiment of the present invention, the field oxide insulation film 12 is formed so that the portion 13a of the side surface portion of the active region 13, located in the forward side of the centrifugal force acting direction F in the spin-coating, has the curved surface convex to the forward side of the centrifugal force acting direction F when the semiconductor substrate 11 is seen in a plan view. The photoresist 15 flown into the concave portions 14b (FIG. 2) on the surface of the electrode film 14 corresponding to the active regions 13, as a result, can flow out of the concave portions 14b in a dispersed manner without concentrating at a small area during the spin-coating in the electrode forming step.

Accordingly, uneven coating can be prevented in a portion located in the front side of the centrifugal force acting direction F with respect to the concave portions 14b on the surface of the electrode film 14, enabling formation of the electrode 16 having higher dimension accuracy. Lowering in dimension accuracy of the resistors 18a and 18b, which are formed after the formation of the electrode 16, due to lowering in dimension accuracy of the electrode 16 can thus be prevented, enabling formation of a semiconductor device having desired characteristics.

Further, in the electrode forming step, the electrode 16 is formed so that the portion 16a of the side surface portion of the electrode 16, located in the backward side of the centrifugal force acting direction F in the spin-coating, has the curved surface convex to the backward side of the centrifugal force acting direction F when the semiconductor substrate 11 is seen in a plan view. The form of the electrode 16 enables smooth mounting of the photoresist 15, which has collided with the convex portion 17a (FIG. 5) corresponding to the electrode on the surface of the resistor film 17, onto the surface of the convex portion 17a with less resistance. Accordingly, uneven coating on the surface of the convex portions 17a and a portion located in the forward side of the centrifugal force acting direction F with respect to the convex portions 17a on the surface of the resistor film 17 can be prevented, enabling formation of the resistors 18a and 18b having a higher dimension accuracy, which enables certain formation of a semiconductor device having desired characteristics.

Further, because a semiconductor device is formed through those steps, even when the plurality of electrodes 16, the plurality of resistors 18a, and the plurality of resistors 18b are formed on the surface of the semiconductor substrate 11, deviation in the dimension accuracy of the electrodes 16 and the resistors 18a and 18b according to locations on the surface of the semiconductor substrate 11 can be prevented, enabling certain formation of a semiconductor device having desired characteristics, as described above.

It should be noted that the technical scope of the present invention is not limited to the above-mentioned embodiment of the present invention, and the embodiment of the present invention can be variously modified as long as it does not deviate from the gist of the present invention.

Figure 2:
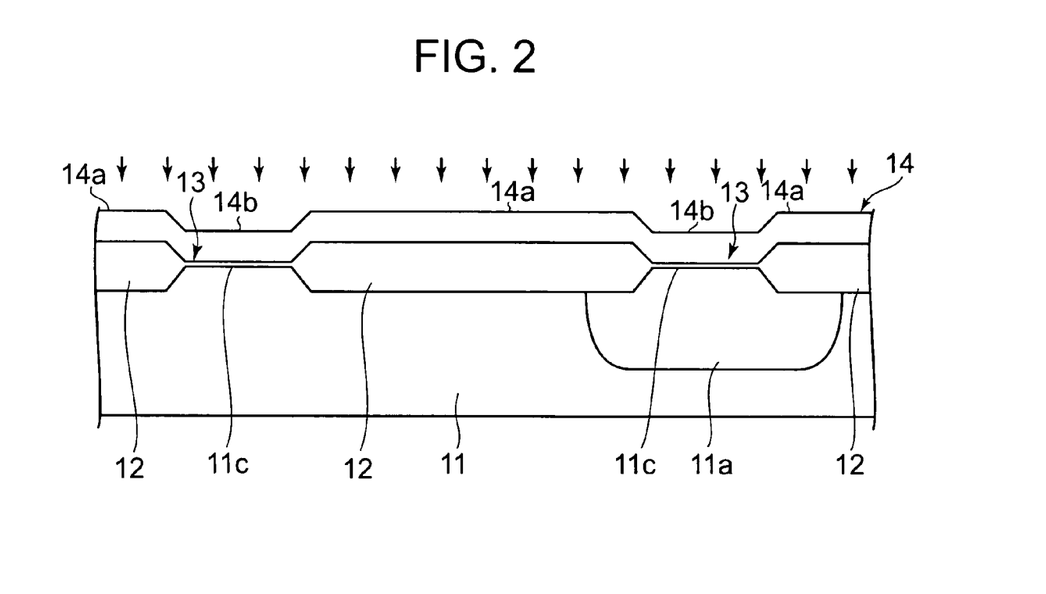
FIG. 2 is a diagram showing a second step of the semiconductor device manufacturing method according the embodiment of the present invention.

For example, in the embodiment of the present invention, in the electrode forming step shown in FIG. 2, the electrode film 14 is formed and the electrode film 14 is ion-implemented with impurities, thereby forming the electrode film 14 into P$^+$-type polysilicon. Alternatively, a so-called doped-CVD method in which impurities are simultaneously mixed in forming the electrode film 14 on the surface of the electrode substrate 11 may be carried out so as to directly form the electrode film 14 of P$^+$-type polysilicon.

Figure 3:
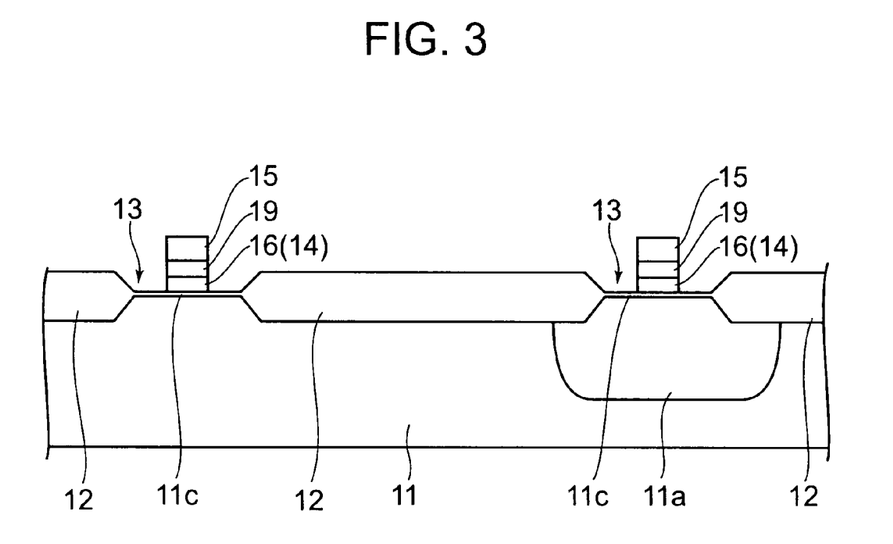
FIG. 3 is a diagram showing a third step of the semiconductor device manufacturing method according the embodiment of the present invention.

Further, in the embodiment of the present invention, in the electrode forming step of FIG. 3, the tungsten silicide layer 19 made of refractory metal silicide is formed on the surface of the electrode layer 14. Alternatively, molybdenum silicide, titanium silicide, or platinum silicide may be used.

Further, in the embodiment of the present invention, in the electrode forming step of FIG. 4, a thermal oxidation CVD method, a low-pressure CVD method, or the like is performed, thereby forming the oxide insulation films 20 having a thickness of 100 Å to 500 Å so as to cover the outer surfaces of the electrodes 16 and the like. Alternatively, on the outer surfaces of the electrodes 16 and the like, insulation films may be formed in each of which an oxide film having a thickness of 300 Å, a nitride film having a thickness of 500 Å formed by the CVD method, and a thermal oxide film having a thickness of 10 Å are laminated in this order.

Further, in the embodiment of the present invention, in the resistor forming step, first, the entire surface of the resistor film 17 is ion-implemented with impurities such as boron, thereby forming the entire resistor film 17 into low-concentration P-type as shown in FIG. 5. Alternatively, without performing the ion-implementation, simultaneously with forming the P-type low-concentration impurity regions 22 in the well diffusion layer 11a as described above referring to FIG. 9, the entire area of the second resistor 18b may be ion-implemented with boron or $BF_2$, thereby forming the second resistor 18b into low-concentration P-type polysilicon.

Further, in the embodiment of the present invention, in the resistor forming step, the predetermined portion of the resistor film 17 is locally ion-implemented with impurities such as phosphorus, thereby forming the portion into the low-concentration N-type as shown in FIG. 6. Alternatively, without performing the ion-implementation, simultaneously with forming the outer peripheral portions of the first resistor 18a into the high-concentration impurity regions 23 as described above referring to FIG. 10, the entire first resistor 18a may be doped with the high-concentration impurities of the high-concentration impurity region 23, thereby forming a resistor having a resistance lower than that of the first resistor 18a obtained in the embodiment of the present invention.

Further, in the embodiment of the present invention, in the resistor forming step, the entire resistor film 17 is ion-implemented with impurities such as boron, thereby forming the entire resistor film 17 into low-concentration P-type as shown in FIG. 5. Alternatively, without performing the ion-implementation, simultaneously with forming the outer peripheral portions of the second resistor 18b into the high-concentration impurity regions 26 as described above referring to FIG. 11, the entire second resistor 18b may be doped with the high-concentration impurities of the high-concentration impurity region 26, thereby forming a resistor having a resistance lower than that of the second resistor 18b obtained in the embodiment of the present invention.

Further, it is possible to form the second resistor 18b simultaneously with forming the electrode film 14 of FIG. 2 into the electrode 16 of FIG. 3.

In addition, in the embodiment of the present invention, as shown in FIG. 12, each of the active region 13 and the electrode 16 includes the convex surface portions. Alternatively, of the side surface portion of the active region 13, at least the portion 13a located in the forward side of the centrifugal force acting direction F in the spin-coating may have the curved surface convex to the forward side of the centrifugal force acting direction F.

Further, in the embodiment of the present invention, as shown in FIG. 12, all the corners of the electrode 16 have the curved surface convex to the backward side of the centrifugal force acting direction F. Alternatively, of the side surface portion of the electrode 16, at least the portion 16a located in the backward side of the centrifugal force acting direction F may have the curved surface convex to the backward side of the centrifugal force acting direction F.

What is claimed is:

1. A semiconductor device manufacturing method, comprising:

a field oxide insulation film forming step comprising:

subjecting a surface of a semiconductor substrate to local oxidization;

forming on the surface of the semiconductor substrate a field oxide insulation film that swells at positions along the surface of the semiconductor substrate; and dividing the surface of the semiconductor substrate into a plurality of active regions using the field oxide insulation film;

an electrode forming step comprising:

forming an electrode film on the surface of the semiconductor substrate;

applying a first photoresist on a surface of the electrode film by spin-coating;

exposing the first photoresist to light; and etching and removing an unnecessary portion of the electrode film to form an electrode; and a resistor forming step comprising:

forming a resistor film on the surface of the semiconductor substrate;

applying a second photoresist on a surface of the resistor film by spin-coating;

exposing the second photoresist to light; and etching and removing an unnecessary portion of the resistor film to form a resistor;

wherein the field oxide insulation film forming step comprises forming the field oxide insulation film so that a portion which corresponds to a side surface portion for each of the active regions, which opposes a rotation center of the surface of the semiconductor substrate for the spin-coating of the first photoresist in the electrode forming step, and which is located at a front side of a centrifugal force acting direction along the surface of the semiconductor substrate, has a curved surface that is convex in a forward direction of the centrifugal force along the surface of the semiconductor substrate as seen in plan view of the semiconductor substrate.

2. A semiconductor device manufacturing method according to claim 1; wherein the etching and removing of the unnecessary portion of the electrode film in the electrode forming step forms the electrode so that a portion of the electrode which corresponds to a side surface portion thereof, which opposes a rotation center of the surface of the semiconductor substrate for the spin-coating of the second photoresist in the resist forming step, and which is located at a side of a centrifugal force acting direction along the surface of the semiconductor substrate has a curved surface that is convex in a rearward direction of the centrifugal force along surface of the semiconductor substrate as seen in plan view of the semiconductor substrate.

3. A semiconductor device manufacturing method according to claim 1; wherein the surface of the semiconductor substrate is divided into the plurality of active regions so that each of the active regions is entirely surrounded by the field oxide insulation film.

4. A semiconductor device manufacturing method according to claim 1; wherein each of the active regions is formed to be concave with respect to the surface of the semiconductor substrate.

5. A semiconductor device manufacturing method according to claim 1; wherein the active regions are formed so that in plan view of the semiconductor substrate, each of the active regions has a generally rectangular shape with each corner of the rectangle corresponding to a side surface portion having the curved surface that is convex in the forward direction of the centrifugal force along the surface of the semiconductor substrate.

6. A semiconductor device manufacturing method according to claim 2; wherein the electrode is formed during the electrode forming step so that the direction of the centrifugal force extends through the side surface portion of the electrode and the side surface portion of the corresponding active region.

7. A semiconductor device manufacturing method according to claim 3; wherein each of the active regions is formed to be concave with respect to the surface of the semiconductor substrate.

8. A semiconductor device manufacturing method according to claim 4; wherein the field oxide insulation film is formed so as to be convex with respect to the surface of the semiconductor substrate.

9. A semiconductor device manufacturing method according to claim 7; wherein the field oxide insulation film is formed so as to be convex with respect to the surface of the semiconductor substrate.

10. A semiconductor device manufacturing method, comprising:
   subjecting a surface of a semiconductor substrate to local oxidization while a plurality of masks are arranged on preselected portions of the surface of the semiconductor substrate;
   forming on the surface of the semiconductor substrate a field oxide insulation film that swells inward and outward with respect to the surface of the semiconductor substrate except at portions corresponding to the preselected portions thereof to thereby define a plurality of active regions at the respective preselected portions;
   forming an electrode film on the field oxide insulation film and the active regions;
   applying a first photoresist on a surface of the electrode film by spin-coating;
   exposing the first photoresist to light;
   etching and removing a portion of the electrode film to form electrodes on the respective active regions;
   forming a resistor film over the surface of the semiconductor substrate including the electrodes;
   applying a second photoresist on a surface of the resistor film by spin-coating;
   exposing the second photoresist to light; and
   etching and removing a portion of the resistor film to form resistors on the surface of the semiconductor substrate;
   wherein the field oxide insulation film is formed so that a portion that corresponds to a side surface portion for each of the active regions, that opposes a rotation center of the surface of the semiconductor substrate during spin-coating of the first photoresist, and that is located at a front side of a centrifugal force acting direction along the surface of the semiconductor substrate, has a curved surface that is convex in a forward direction of the centrifugal force along the surface of the semiconductor substrate as seen in plan view of the semiconductor substrate.

11. A semiconductor device manufacturing method according to claim 10; wherein the etching and removing of the portion of the electrode film forms the electrodes so that a portion of each electrode that corresponds to a side surface portion thereof, that opposes a rotation center of the surface of the semiconductor substrate during the spin-coating of the second photoresist, and that is located at a side of a centrifugal force acting direction along the surface of the semiconductor substrate has a curved surface that is convex in a rearward direction of the centrifugal force along the surface of the semiconductor substrate as seen in plan view of the semiconductor substrate.

12. A semiconductor device manufacturing method according to claim 10; wherein the active regions are formed so as to be entirely surrounded by the field oxide insulation film.

13. A semiconductor device manufacturing method according to claim 10; wherein each of the active regions is formed to be concave with respect to the surface of the semiconductor substrate.

14. A semiconductor device manufacturing method according to claim 10; wherein the active regions are formed so that in plan view of the semiconductor substrate, each of the active regions has a generally rectangular shape with each corner of the rectangle corresponding to a side surface portion having the curved surface that is convex in the forward direction of the centrifugal force along the surface of the semiconductor substrate.

15. A semiconductor device manufacturing method according to claim 12; wherein each of the active regions is formed to be concave with respect to the surface of the semiconductor substrate.

16. A semiconductor device manufacturing method according to claim 13; wherein the field oxide insulation film is formed so as to be convex with respect to the surface of the semiconductor substrate.

17. A semiconductor device manufacturing method according to claim 15; wherein the field oxide insulation film is formed so as to be convex with respect to the surface of the semiconductor substrate.

* * * * *